Feb. 25, 1969 J. R. CRICCHI 3,430,065

LOGIC CIRCUIT UTILIZING BREAKDOWN DIODES WITH DIFFERENT BREAKDOWN VOLTAGES

Filed Aug. 9, 1965

INVENTOR.
James R. Cricchi.

BY Dean Schron

ATTORNEY

United States Patent Office 3,430,065

Patented Feb. 25, 1969

3,430,065

LOGIC CIRCUIT UTILIZING BREAKDOWN DIODES WITH DIFFERENT BREAKDOWN VOLTAGES

James R. Cricchi, Catonsville, Md., assignor to Westinghouse Electric Corporation, Pittsburgh, Pa., a corporation of Pennsylvania Filed Aug. 9, 1965, Ser. No. 478,320
U.S. Cl. 307—215 5 Claims
Int. Cl. H03k 19/34, 19/36

ABSTRACT OF THE DISCLOSURE

A logic circuit which includes an input which receives one or more input logic signals for controlling the conducting or non-conducting state of an output transistor. Connected between the input and the base of the transistor is a first Zener diode connected to the input and a second Zener diode connected to the base of the transistor with the cathodes of the Zener diodes being connected together and through a resistor to a source of operating potential. The second Zener diode has a higher breakdown voltage than the first Zener diode, the difference in breakdown voltages providing the isolation necessary for such circuits.

This invention in general relates to transistor logic circuits, and more particularly to transistor logic circuits incorporating breakdown diodes.

A popular form of logic circuit is the NAND (or NOR) circuit which includes an output transistor operable in an on and an off mode of operation depending upon the value of logic signals applied to the input of the logic device. Basically, in a NAND circuit the output transistor will provide a ZERO output signal (transistor on) when all of the input signals are ONES. The output transistor will provide a ONE output signal (transistor off) when one or more of the input signals is a ZERO. In Zener Coupled Diode Transistor Logic circuit, a Zener diode having an extremely small breakdown voltage, in the order of one or two volts, is provided between the input of the device and the base of the output transistor in order to insure proper isolation. That is, without the presence of the Zener diode in the base circuit, the presence of a ZERO signal to the input circuit could erroneously cause the output transistor to turn on. Additionally, the Zener diode provides proper isolation against extraneous noise voltages which would tend to turn the transistor on, thus affecting proper operation.

Many types of logic circuits may be fabricated by integrated circuit techniques whereby the discrete components of the circuit are incorporated into a tiny semiconductor chip. Integrated circuits possess many desirable qualities, among which are small size and improved reliability.

There are two popular methods of semiconductor device fabrication. One is the alloy technique, wherein alloying contacts or dots are placed upon a semiconductor wafer. Heat applied to the configuration melts the dots, dissolving some of the semiconductor wafer, thereby resulting in an alloy solution. When the heat is removed, recrystallization takes place. The other method is the diffusion technique wherein the semiconductor wafer is placed into a capsule containing impurity elements and diffusion is caused to take place at elevated temperatures; there is however, no melting operation as in the alloy process. The diffusion technique is more versatile and the more popular of the two techniques for integrated circuits.

In Zener Coupled Diode Transistor Logic, a single Zener diode located in the base circuit of the transistor requires a breakdown voltage of approximately one or two volts.

Although Zener diodes may be fabricated by diffusion techniques, it is not practical to make a Zener diode with as low a breakdown voltage of one or two volts and consequently Zener diodes resulting from a diffusion technique cannot easily be made with breakdown voltages less than approximately 6 volts. The alloying techniques allows a Zener diode to be fabricated with a lower breakdown voltage. The situation arises therefore where it is desired to fabricate an integrated circuit by the diffusion technique but which contains a circuit component which must be fabricated by the alloy technique.

It is therefore an object of the present invention to provide a Zener Coupled Diode Transistor Logic circuit which is particularly well adapted to be fabricated by integrated circuit techniques.

It is another object of the present invention to provide a Zoner Coupled Diode Transistor Logic circuit which is particularly well adapted to be entirely fabricated by integrated circuit diffusion techniques.

Another object is to provide an improved Zener Coupled Diode Transistor Logic circuit which provides proper isolation.

Briefly, in accordance with the above objects, there is provided a Zener Coupled Diode Transistor Logic circuit which includes input means for receiving one or more input logic signals for providing a resultant signal at a summing point. An output transistor operable in an on and off mode of operation provides an output signal as determined by the function of the logic circuit and the input, or combination of input signals. Connected between the summing point and the base of the transistor is an isolation network which includes a pair of breakdown devices in the form of Zener diodes connected in back-to-back relationship. These Zener diodes are chosen to have different breakdown voltages with the difference between the breakdown voltages being somewhat in the order of the desired isolation. Means are provided for connecting the junction point between the Zener diodes to a source of operating potential.

Since only the voltage difference between the breakdown voltages of the Zener diodes is instrumental in the isolation function, the Zener diodes may be fabricated, along with the other components of the logic circuit, as an integrated circuit by diffusion techniques since Zener diodes with somewhat elevated breakdown voltages are easily fabricated by such techniques.

In another embodiment of the invention, means are provided to bias the Zener diodes in or near their breakdown mode. With the Zener diodes constantly in their breakdown mode, the current levels in the Zener diodes are changed in accordance with the combination of input signals. Since the Zener diodes do not have to switch to their breakdown mode, much faster operation of the logic circuit may be obtained, while still retaining the isolation function.

The above-mentioned as well as further objects and advantages of the present invention will become apparent from the following description when taken in conjunction with the accompanying drawings in which.

Figure 1:
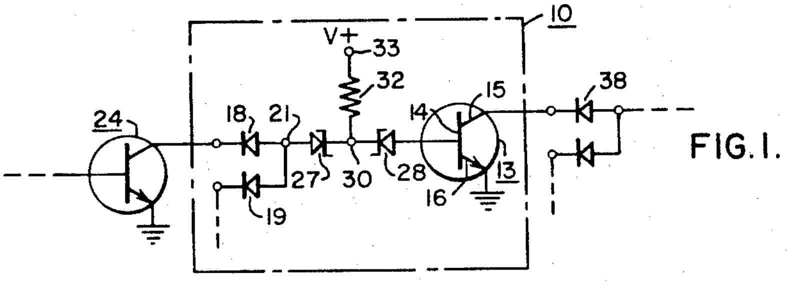
FIGURE 1 illustrates an embodiment of the present invention.

In FIGURE 1, a logic circuit generally designated 10 includes an output transistor 13 having a base electrode 14, a collector electrode 15, and an emitter electrode 16 connected to a common circuit point illustrated as ground. Input means to the logic device include a plurality of diodes of which two, 18 and 19, are illustrated. Each of the diodes has a like electrode, their anodes, connected to a summing point 21.

Input logic signals are applied to the cathodes of the diodes 18 and 19 from a previous stage or stages. The output transistor 24 of the previous stage is illustrated and has its collector electrode connected to the input diode 18. A first breakdown device in the form of Zener diode 27 and a second breakdown device in the form of Zener diode 28 are connected in back-to-back relationship with their cathodes connected together. The anode of the Zener diode 27 is connected to the summing point 21, and the anode of Zener diode 28 is connected to the base electrode 14 of the transistor 13. Connected to the junction point 30 between the Zener diodes is a resistor 32 having its other end connected to voltage terminal 33 to which is applied, for the logic circuit illustrated, a positive voltage. The Zener diodes 27 and 28 have different breakdown voltages, with the breakdown voltage of the second Zener diode 28 being greater than the breakdown voltage of the Zener diode 27.

Figure 2:
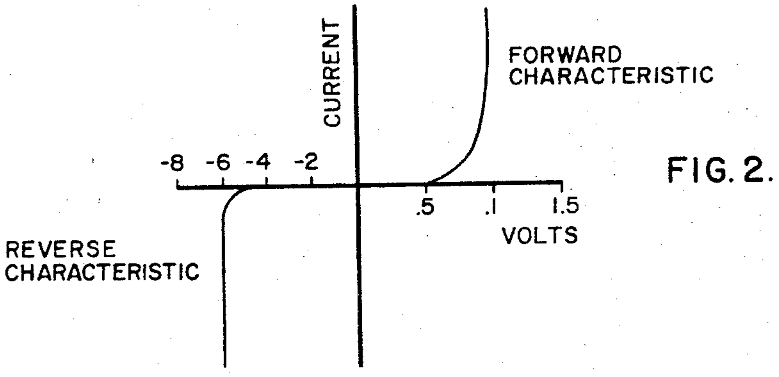
FIG. 2 illustrates a typical Zener diode curve to aid in understanding of the present invention.

The breakdown voltage of the Zener diode is illustrated by way of example in FIGURE 2. As illustrated in FIG. 2, Zener diodes exhibit the characteristic of a regular semiconductor diode in the forward direction. With forward bias applied to the Zener diode, the Zener diode will support current flow after about 0.6 volt (for a silicon diode). The reverse characteristic illustrates that when the Zener diode is reversed biased, substantially no current will flow as the back bias increases, until a critical point is reached, beyond which current condition increases rapidly. This is the Zener region and the critical point where the breakdown takes place and is herein termed the breakdown voltage, illustrated in FIG. 2 at 6 volts. Zener diodes with greater breakdown voltages are similarly available.

For purposes of explanation, the curve illustrated in FIG. 2 may be the voltage-current characteristic of the first Zener diode 27. The second Zener diode 28 will then have a higher breakdown voltage, for example in the order of 8 volts. The voltage terminal 33 is connected to a positive voltage source greater than the breakdown voltage of the second Zener diode 28. The collector electrode 15 of output transistor 13 is connected to diode 38 constituting an input diode to a following stage. Alternatively, the output transistor 13 may provide its output signal to other types of utilization circuits.

Figure 3:
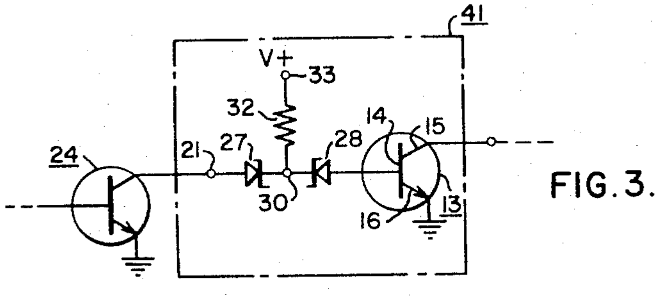
FIG. 3 illustrates another embodiment of the present invention.

Before proceeding with an explanation of the operation of the circuit of FIG. 1, reference should be made to FIG. 3 which shows a modification of the circuit of FIG. 1. Reference numerals used in FIG. 3 designate like components illustrated in FIG. 1. The logic circuit 41 is a single input device and the output of the previous stage transistor 24 feeds directly, to the summing point 21. The circuit of FIG. 3 therefore performs an inversion or NOT function.

Figure 4A:
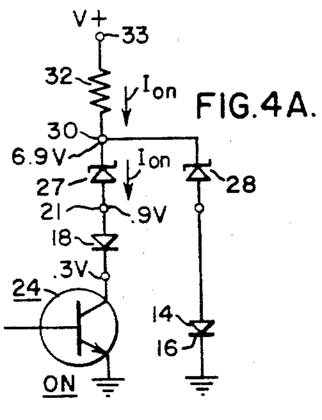
FIGS. 4A and 4B illustrate circuit diagrams to aid in an explanation of the operation of the embodiment of FIG. 1.
Figure 4B:
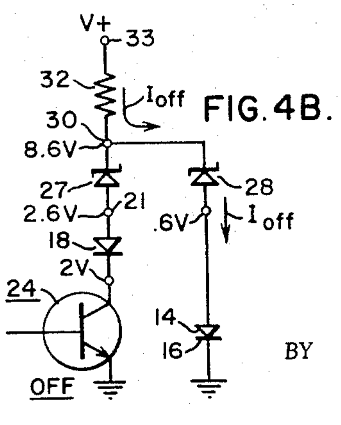

The operation of the invention may best be described by making reference to FIGS. 4A and 4B.

The circuits of FIGS. 4A and 4B have identical counterparts in FIG. 1, however, diode 19 and collector 15 have been omitted for purposes of clarity. The NAND gate illustrated in FIG. 1 operates such that if any of the previous stage output transistors is on, the output transistor 13 will be off; that is, if the logic gate 10 receives at least a ZERO its output will be a ONE. This situation is illustrated in FIG. 4A. With transistor 24 in an on condition a current path is established (assuming current flow from positive to negative) from V+ through resistor 32 through the first Zener diode 27, through diode 18, and through the collector-emitter circuit of transistor 24 to ground. Assuming that the semiconductor devices illustrated are silicon devices, the current $I_{on}$ will cause the following voltage drops: the voltage drop across the transistor 24 will be approximately 0.3 volt; the voltage drop across the diode 18 will be approximately 0.6 volt thereby making the voltage at the summing point 21 0.9 volt. The first Zener diode 27, it will be remembered, has a breakdown voltage of 6 volts and therefore the voltage at the junction point 30 will be the 6 volts plus the 0.9 volt or 6.9 volts. It is to be noted that if the summing point 21 were connected directly to the base of the output transistor 13, the 0.9 volt appearing at the summing point 21 would be enough to turn on the output transistor thus giving an erroneous output signal. The 6.9 volts at junction point 30 is not enough to break down the second Zener diode 28 which, it will be remembered, has a breakdown voltage of 8 volts. In FIG. 1 the base electrode 14 and the emitter electrode 16 form a base-emitter diode. This diode is illustrated in FIG. 4A as having an anode 14 (the base electrode) and a cathode 16 (the emitter electrode). Since the second Zener diode 28 is not in its breakdown condition, substantially no current flows into the output transistor which therefore remains in an off condition representing a ONE output signal.

The logic circuit 10 of FIG. 1 additionally operates such that if all of the input signals are ONES, the output transistor 13 will be turned on to provide a ZERO output signal. FIG. 4B illustrates this operation. For all ONES to be applied to the input diodes, the previous stage output transistors must be in an off condition. Only one of these transistors, 24, is illustrated in FIGURE 4B although it is to be understood that other transistor diode combinations connected to summing point 21 are also providing ONE input signals.

With the transistor 24 in an off condition, current $I_{off}$ flows from V+, through resistor 32, through the second Zener diode 28, and through the base-emitter diode 14–16 of the output transistor. The output transistor 13 turns on to thereby provide a ZERO output signal to a subsequent stage. The voltage at the base electrode 14 is approximately 0.6 volt, and the voltage at junction point 30 is approximately 8.6 volts since the breakdown voltage of the second Zener diode 28 is 8 volts.

The voltage representing a ZERO signal is approximately 0.3 volt since this is the voltage drop across a transistor in a saturated or on state. The voltage representing a ONE signal is approximately 2 volts. This voltage may be ascertained by examining the circuit of FIG. 4B. Junction point 30 is at 8.6 volts. The voltage which would appear at the anode of the first Zener diode having a 6 volt breakdown voltage therefore would be 2.6 volts. The 2.6 volts appearing at the summing point 21 would reflect back through diode 18 as 2 volts at its cathode (connected to the collector electrode of transistor 24) since the voltage drop across the diode 18 is in the order of 0.6 volt. For an embodiment of the present invention which operates at faster switching speeds, reference should now be made to FIG. 5.

Figure 5:
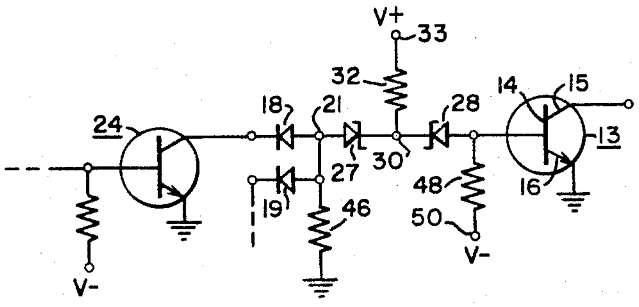
FIG. 5 illustrates another embodiment of the present invention.

The circuit of FIG. 5 is similar in many respects to the circuit of FIG. 1 and reference numerals are repeated to designate like components. In the circuit of FIG. 5, means are provided in order to constantly keep the Zener diodes 27 and 28 in their breakdown mode. In the circuit of FIG. 5, the means for biasing the Zener diodes 27 and 28 into their breakdown mode include a first resistor 46 connected between summing point 21 and a common circuit point illustrated as ground. A second resistor 48 has one end connected to the base electrode 14 and its other end connected to terminal 50 to which is applied a negative potential V−.

Figure 5A:
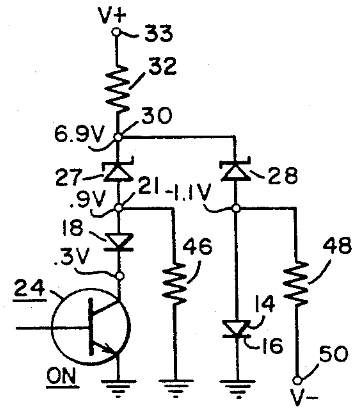
FIGS. 5A and 5B illustrate circuit diagrams to aid in an explanation of the operation of the embodiment of FIG. 1.
Figure 5B:
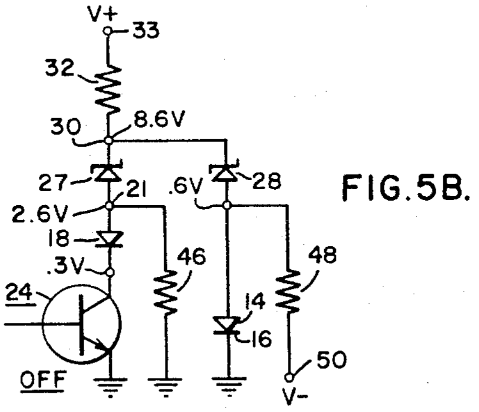

FIGS. 5A and 5B illustrate the operation of the circuit of FIG. 5. FIG. 5A illustrates the situation wherein the previous transistor 24 is in its on condition and providing a ZERO input signal. A current path is established from V+ through resistor 32, through the first Zener diode 27, through diode 18, through the collector-emitter circuit of transistor 24, and a relatively small current flows through resistor 46 to ground. The voltage drop across transistor 24 will be approximately 0.3 volt; the voltage drop across the diode 18 will be approximately 0.6 volt thereby making the voltage at summing point 21 0.9 volt. Since Zener diode 27 has a breakdown voltage of 6 volts, the voltage at junction point 30 will be the 6 volts plus the 0.9 volt or 6.9 volts. Whereas in FIG. 4A the Zener diode 28 was in its non-breakdown condition, in FIG. 5A Zener diode 28 is maintained in its breakdown mode. This is accomplished by the connection of resistor 48 between the base electrode 14 and V− which by way of example may be in the order of −3 volts. Since the voltage at the cathode of the Zener diode 28 is 6.9 volts, it alone is not sufficient to break down the 8 volt Zener diode 28. The provision of the −3 volts at terminal 50 however has the effect of adding positive voltage to the cathode of Zener diode 28 and in fact the breakdown voltage of Zener diode 28 is exceeded so that it remains in its breakdown mode and the voltage at the base electrode 14 is in the order of −1.1 volts (−8+6.9). The −1.1 volts at the base electrode 14 of the output transistor insures that it remains in an off condition thereby representing a ONE output signal.

FIG. 5B illustrates the situation wherein all of the input signals are ONES. A typical input transistor 24 is switched to its off condition and the voltage at point 30 rises. Since the voltage drop across the Zener diode 28 is constant, the rising voltage at point 30 appears at the base electrode 14 of the output transistor and will continue to rise until such time as the transistor turns on thereby clamping the voltage at the base of the transistor to 0.6 volt. Since the Zener diode 28 has a breakdown voltage of 8 volts, the voltage at point 30 will be clamped at 8.6 volts. Resistor 46 is chosen to have a relatively high value, so the current flow from V+, through resistor 32, through Zener diode 27, and through resistor 46 to ground will be relatively small.

In both situations illustrated in FIGS. 5A and 5B, Zener diodes 27 and 28 are constantly in their breakdown mode with only the current flow therethrough changing between high and low values. Since the Zener diodes do not have to constantly switch to their breakdown mode as different input signals are applied to the logic gate, a faster operating logic circuit results. With the arrangement of FIG. 5 the base voltage of the output transistor varies, in the example shown, between −1.1 volts and 0.6 volt representing a noise isolation of 1.7 volts.

The conditions illustrated in FIGS. 5A and 5B are somewhat similar to the conditions illustrated in FIGS. 4A and 4B in that the difference in current through resistor 32 when transistor 24 is on and when transistor 24 is off is governed by the relatively little voltage difference appearing at point 30. Whereas in FIG. 4A the total current flowed through transistor 24, in FIG. 5A this current is somewhat reduced due to the fact that a relatively small value of current is flowing through resistor 46 and through resistor 48. Similarly in FIG. 5B, the value of current flowing through the base-emitter diode 14–16 of the output transistor is somewhat reduced than that illustrated in FIG. 4B due to a small current through resistors 46 and 48. The same principles as brought out with respect to FIGS. 4A and 4B however, are applicable to FIGS. 5A and 5B in that lower beta transistors may be utilized.

In FIG. 4A the current $I_{on}$ in the collector-emitter circuit of transistor 24 represents the collector current of the transistor. In FIGURE 4B the current $I_{off}$ is the base current of the output transistor. The ratio of $I_{on}$ to $I_{off}$ is the ratio of collector current to base current and is termed the $\beta$ of a transistor. Both the $I_{on}$ and $I_{off}$ currents are determined by the supply voltage, the value of resistor 32, and the voltage at junction point 30. In the present invention the voltage difference at junction point 30 when the output transistor is off and when the output transistor is on is relatively small. In the example illustrated the voltage difference is (8.6)−(6.9) or 1.7 volts. Since the supply voltage and resistor 32 are the same for both cases, the value of $I_{on}$ and $I_{off}$ currents are governed by the voltage at junction point 30 and since the voltage difference is relatively small in the on and off cases, transistors with lower $\beta$'s may be utilized. If only one Zener diode were used for isolation purposes, and had a breakdown voltage in the order of 6 volts, the voltage difference which would determine the $I_{on}$ and the $I_{off}$ currents would be relatively larger and the required $\beta$ would be proportionally larger. In addition the greater current would cause greater power dissipation whereas in the present invention, power dissipation is reduced even though the Zener diodes have somewhat elevated breakdown voltages.

There has been provided therefore an improved Zener diode transistor logic circuit which not only provides proper isolation between the input means and the output transistor but which utilizes an isolation network which may be fabricated by integrated circuit techniques compatible with the fabrication of the remaining components of the logic circuit.

Although the present invention has been described with a certain degree of particularity, it should be understood that the present disclosure has been made by way of example and that modifications and variations of the present invention are made possible in the light of the above teachings.

I claim as my invention:

1. A logic circuit comprising:
(a) an output transistor;
(b) a summing point;
(c) input means for receiving input logic signals, and connected to said summing point;
(d) first and second breakdown diodes connected in back-to-back relation, with said first breakdown diode being connected to said summing point and said second breakdown diode being connected to the base electrode of said transistor;
(e) said second breakdown diode having a greater breakdown voltage than said first breakdown diode; and
(f) means for connecting the junction between said first and second breakdown diodes to a source of operating potential.

2. A logic circuit according to claim 1 wherein:
(a) the input means includes a plurality of input diodes each having a like electrode connected to the summing point.

3. A logic circuit comprising:
(a) an output transistor;
(b) a summing point;
(c) input means for receiving input signals and connected to said summing point;
(d) a first Zener diode having its anode electrode connected to said summing point;
(e) a second Zener diode having its cathode electrode connected to the cathode electrode of said first Zener diode and its anode electrode connected to the base electrode of said transistor;
(f) said second Zener diode having a greater breakdown voltage than said first Zener diode;
(g) a resistor connected to the cathode electrodes of said first and second Zener diodes; and
(h) means for connecting said resistor to a suitable source of operating potential.

4. A logic circuit comprising:
(a) an output transistor;
(b) a summing point;
(c) input means for receiving input logic signals, and being connected to said summing point;
(d) a pair of Zener diodes serially connected between said summing point and the base of said transistor;
(e) the Zener diode connected to the base of said transistor having a higher breakdown voltage than the Zener diode connected to said summing point;
(f) means for connecting the junction point between said Zener diodes to a source of operating potential; and
(g) means for concurrently biasing both said Zener diodes into their breakdown mode.

5. A logic circuit comprising:
(a) an output transistor;
(b) a summing point;
(c) input means for receiving input logic signals, and connected to said summing point;
(d) a pair of Zener diodes connected in back-to-back relationship connected between said summing point and the base electrode of said transistor;
(e) the Zener diode connected to the base of said transistor having a higher breakdown voltage than the Zener diode connected to said summing point;

(f) means for connecting the junction point between said Zener diodes to a source of operating potential;
(g) first resistor means connected between said summing point and a common circuit point;
(h) second resistor means having one end connected to the base electrode of said output transistor; and
(i) means for applying a bias potential to the other end of said second resistor means.

References Cited

UNITED STATES PATENTS 3,165,641 1/1965 Cubert -------------- 307—207

OTHER REFERENCES

Logue et al.: I.B.M. Tech. Dis. Bull, vol. 1, No. 6, April 1959, pp. 23 and 24.

Pressman: Design of Transistorized Circuits for Digital Computers, March 1959, pp. 147 and 148.

ARTHUR GAUSS, *Primary Examiner.*

DONALD D. FORRER, *Assistant Examiner.*

U.S. Cl. X.R.

307—218, 318